(12) United States Patent
Wong

(10) Patent No.: US 6,784,004 B2
(45) Date of Patent: Aug. 31, 2004

(54) METHOD OF DETERMINING POST-ETCH OFFSET IN EXPOSED-TO-EMBEDDED OVERLAY

(75) Inventor: Alan Wong, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/662,021

(22) Filed: Sep. 11, 2003

(65) Prior Publication Data

US 2004/0060028 A1 Mar. 25, 2004

Related U.S. Application Data

(62) Division of application No. 09/751,235, filed on Dec. 30, 2000.

(51) Int. Cl.[7] ............................................. H01L 21/66
(52) U.S. Cl. ......................................................... 438/14
(58) Field of Search ............................................ 438/14

(56) References Cited

U.S. PATENT DOCUMENTS

| | | | |
|---|---|---|---|
| 3,371,085 A | 2/1968 | Reeder et al. | |
| 5,308,682 A | 5/1994 | Morikawa | |
| 6,218,200 B1 * | 4/2001 | Chen et al. | 438/14 |
| 6,258,611 B1 * | 7/2001 | Leroux | 438/14 |
| 6,368,921 B1 | 4/2002 | Hijzen et al. | |
| 6,413,827 B2 | 7/2002 | Farrar | |
| 6,423,555 B1 * | 7/2002 | Babcock | 438/14 |
| 6,465,263 B1 * | 10/2002 | Coss et al. | 438/14 |
| 6,484,064 B1 * | 11/2002 | Campbell | 700/100 |
| 6,716,649 B2 * | 4/2004 | Ziger | 438/14 |

* cited by examiner

Primary Examiner—Stacy A. Whitmore
(74) Attorney, Agent, or Firm—George Chen

(57) ABSTRACT

The present invention describes a structure for and a method of forming a first set and a second set of features in a substrate; covering the first and second set of features with a material; forming a third set of features in the material and removing the material to expose the first set of features, leaving the second set of features embedded below the material; measuring post-etch overlay between the first set and the third set of features; and measuring post-develop overlay between the second set and the third set of features.

8 Claims, 4 Drawing Sheets

US 6,784,004 B2

METHOD OF DETERMINING POST-ETCH OFFSET IN EXPOSED-TO-EMBEDDED OVERLAY

This is a Divisional application of Ser. No. 09/751,235, filed Dec. 30, 2000, which is presently pending.

BACKGROUND OF THE INVENTION

1. Field of the Invention

The present invention relates to the field of semiconductor integrated circuit (IC) manufacturing, and more specifically, to improving the design of an overlay structure.

2. Discussion of Related Art

Many parameters of a semiconductor device must be monitored during fabrication to assure that the device will meet the specifications for performance and reliability at the end of the line. Since device fabrication may involve as many as 30 layers, it is particularly important to measure the overlay of the critical layers to each other. One critical overlay for a microprocessor is polysilicon gate layer to shallow trench isolation layer. Another critical overlay is first metal layer to contact layer.

It is very challenging to measure overlay directly in a product die on a wafer. This is because of the extremely small horizontal and vertical dimensions of the features and the multiple layers of material stacked on the wafer. However, test structures representing any two layers of interest may be placed in the scribelines separating the die. Then, overlay data, collected in accordance with a statistically valid sampling plan, may be analyzed using an appropriate model. The overlay may be partitioned into an orthogonal set of components which correspond to physically meaningful parameters on the step-and-scan tool that exposed the wafer. Such a feedback loop allows the step-and-scan tool to be adjusted to improve overlay on wafers processed later.

As the design groundrules continue to shrink, it becomes increasingly critical to design a robust overlay structure to accommodate the process variations that can introduce considerable noise into an overlay measurement. As an example, gate layer is usually formed from polysilicon that has been deposited by chemical vapor deposition (CVD) and planarized by chemical-mechanical polishing (CMP). These processes affect the thickness, roughness, and graininess of the polysilicon, thus making overlay measurement difficult.

Overlay refers to the relative placement of a subsequent layer with reference to a previous layer. Overlay is generally measured in two orthogonal orientations. The orientations are usually chosen to correspond to the x-axis and the y-axis of the stage of the step-and-scan tool used to expose photoresist on the layers. For illustrative purposes in the following description, the polysilicon gate layer will be chosen as the subsequent or second layer and the shallow trench isolation layer will be chosen as the previous or first layer.

FIG. 1 shows a cross-sectional view of a wafer 5 in one of the two orientations after develop. The substrate 10 is formed from a semiconductor material such as silicon. Then the surface of the substrate 10 is covered with silicon oxide 30. The outer bars 15 are formed at the first layer from shallow trenches that have been filled with a dielectric material 20. After depositing a layer of polysilicon 40 over the entire wafer, a coat of photoresist is applied. A step-and-scan tool aligns layer two (on a mask) to layer one (on the wafer) and then exposes the photoresist through the mask to form a latent image of the desired pattern from the mask in the photoresist. The inner bars 45 are formed after developing the photoresist 50.

Overlay is measured after develop since, if necessary, the photoresist may be removed and re-applied for patterning again before etching is performed. First, the centerline 54 of the inner bars 45 is determined from the midpoint of the distance 52 between the centers of the inner bars. Second, the centerline 14 of the outer bars 15 is determined from the midpoint of the distance 12 between the centers of the outer bars. Finally, the overlay after develop is calculated as the difference 24 between the centerline 54 of the inner bars 45 and the centerline 14 of the outer bars 15.

FIG. 2 shows a cross-sectional view of a wafer 7 after etch in the same orientation as FIG. 1. The top of the outer bars 15 is now exposed since the overlying polysilicon layer has been removed by the etch. The inner bars 45 are formed from polysilicon 40.

Overlay is also measured after etch. Rework of the photoresist is no longer possible, but the etch must be monitored since the pattern in the photoresist has been transferred into the layers of material on the wafer. First, the centerline 55 of the inner bars 46 is determined from the midpoint of the distance 53 between the centers of the inner bars 46. Second, the centerline 17 of the outer bars 15 is determined from the midpoint of the distance 13 between the centers of the outer bars 15. Finally, the overlay after etch is calculated as the difference 25 between the centerline 55 of the inner bars 46 and the centerline 17 of the outer bars 15.

It is preferable to measure post-develop overlay at a layer because rework of the photoresist is still possible. However, data from cross-sectioned wafers reveal that post-etch overlay is a better predictor of overlay in product devices than post-develop overlay. Overlay measurement becomes more consistent after etch because polysilicon has been removed from over the overlay structure. Consequently, it is often necessary to measure overlay after develop and again after etch in order to determine an etch offset. The etch offset is then applied to correct subsequent post-develop measurements. Unfortunately, the etch offset is not very consistent unless results are obtained by measuring the same locations on the same wafers after develop and after etch. Such a procedure is laborious and time consuming. Furthermore, the etch offset must be updated frequently since it will often fluctuate.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

One embodiment of the present invention describes a novel post-etch overlay structure that allows the measurement of both post-etch overlay and the equivalent of post-develop overlay. The overlay structure may have multiple targets, such as three pairs of targets. Each target may be a bar, a twin bar, a trench, a twin trench, a series of holes, or a series of pillars. The various targets may differ in shape, dimension, and spacing. Another embodiment of the present invention describes a novel post-etch methodology that determines an offset to correct the measurement of post-develop overlay.

Figure 1:
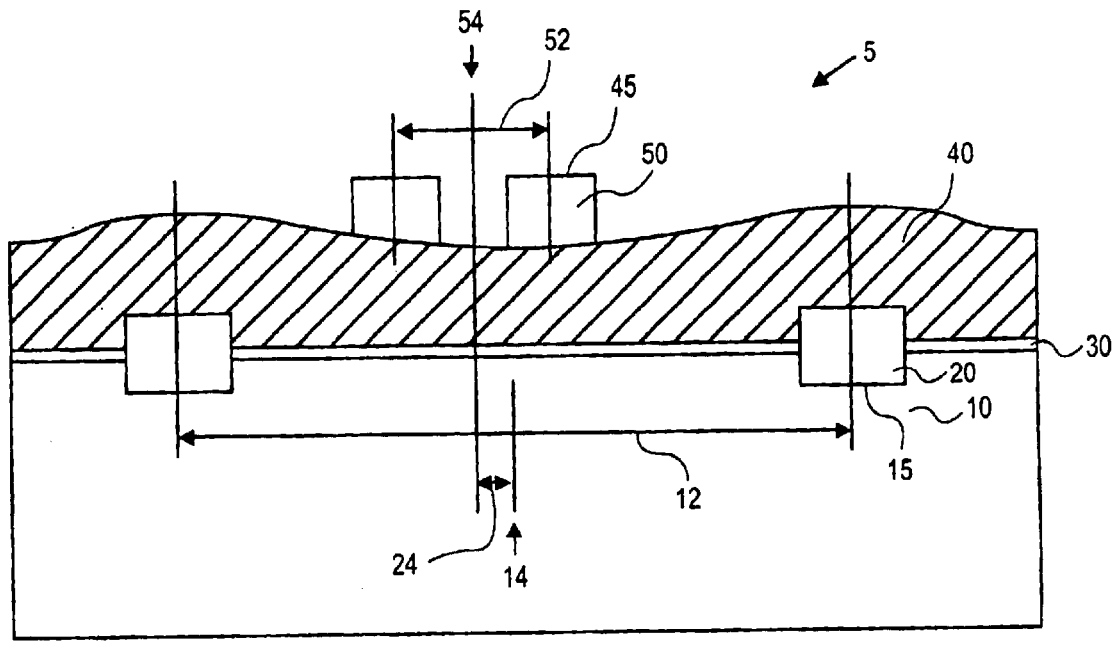
FIG. 1 is an illustration of a cross-sectional view of an overlay structure after develop (prior art).
Figure 2:
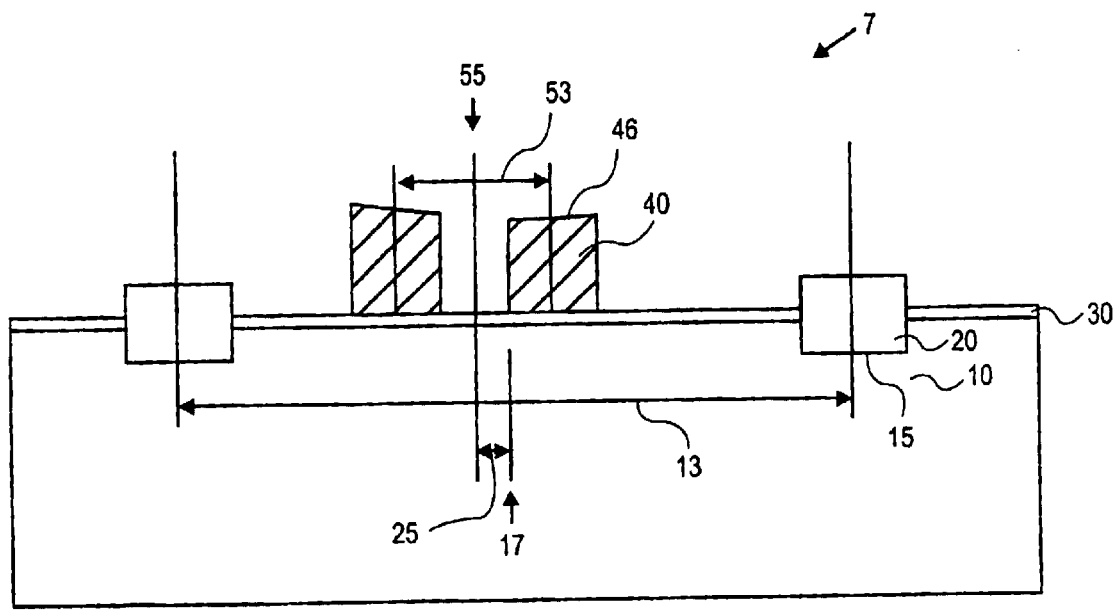
FIG. 2 is an illustration of a cross-sectional view of an overlay structure after etch (prior art).
Figure 3A:
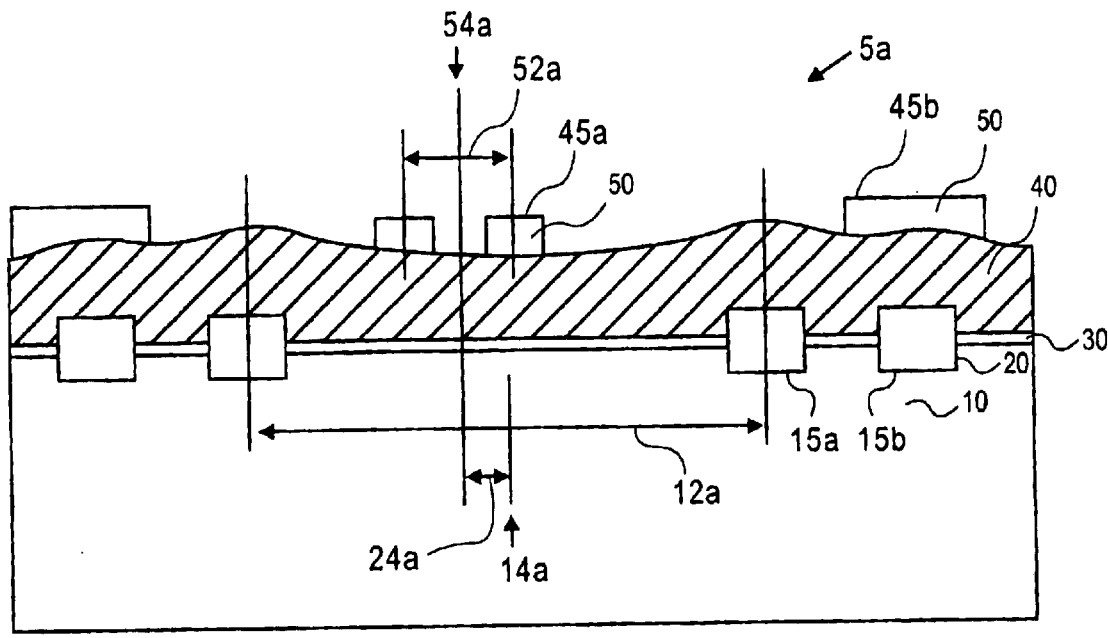
FIG. 3(a) is an illustration of a cross-sectional view of a novel overlay structure for a transparent film after develop.

FIG. 3(a) shows a cross-sectional view of a novel overlay structure for a layer with transparent material 40, such as polysilicon, on a wafer 5a after develop of photoresist. The substrate 10 is formed from a semiconductor material such as silicon. The surface of the substrate 10 is covered with silicon oxide 30. It is desirable to form the overlay structure with product-like features. In one embodiment of the present invention, a first set 15a and a second set 15b of features, such as outer bars, are formed at an earlier layer, such as shallow trench isolation layer, from trenches that have been filled with a dielectric material 20. In some cases, the dielectric material 20 may protrude out of the top of the trenches. The first set 15a of outer bars and the second set 15b of outer bars are parallel and located near each other. The two sets of outer bars are usually coplanar.

After depositing a layer of transparent material 40, such as polysilicon, over the entire wafer at a subsequent layer, such as polysilicon gate layer, photoresist is applied. A step-and-scan tool aligns the pattern from the subsequent layer (on a mask) to the pattern from the earlier layer (on the wafer) and then exposes the photoresist through the mask to form a latent image of the desired pattern from the mask in the photoresist. The inner bars 45a are formed after developing the photoresist 50. Protective pads 45b are also formed in the photoresist over the second set 15b of outer bars. The inner bars 45a and the protective pads 45b are nominally parallel to the first set 15a and the second set 15b of outer bars.

Overlay of the novel overlay structure is initially measured after develop. First, the centerline 54a of the inner bars 45a is determined from the midpoint of the distance 52a between the centers of the inner bars 45a. The centerline is the location from which the two bars are equidistant. The inner bars 45a are nominally parallel to but located some distance away from the first set 15a of outer bars and the second set 15b of outer bars. Second, the centerline 14a of the first set 15a of outer bars is determined from the midpoint of the distance 12a between the centers of the first set 15a of outer bars. The deviation in the location of the two centerlines is a measurement of their overlay. As a result, the overlay after develop is calculated as the difference 24a between the centerline 54a of the inner bars 45a and the centerline 14a of the first set 15a of outer bars. The second set of outer bars 15b is not usually measured after develop since it is embedded below the transparent material 40 that is covered by the protective pads 45b in the photoresist.

Figure 3B:
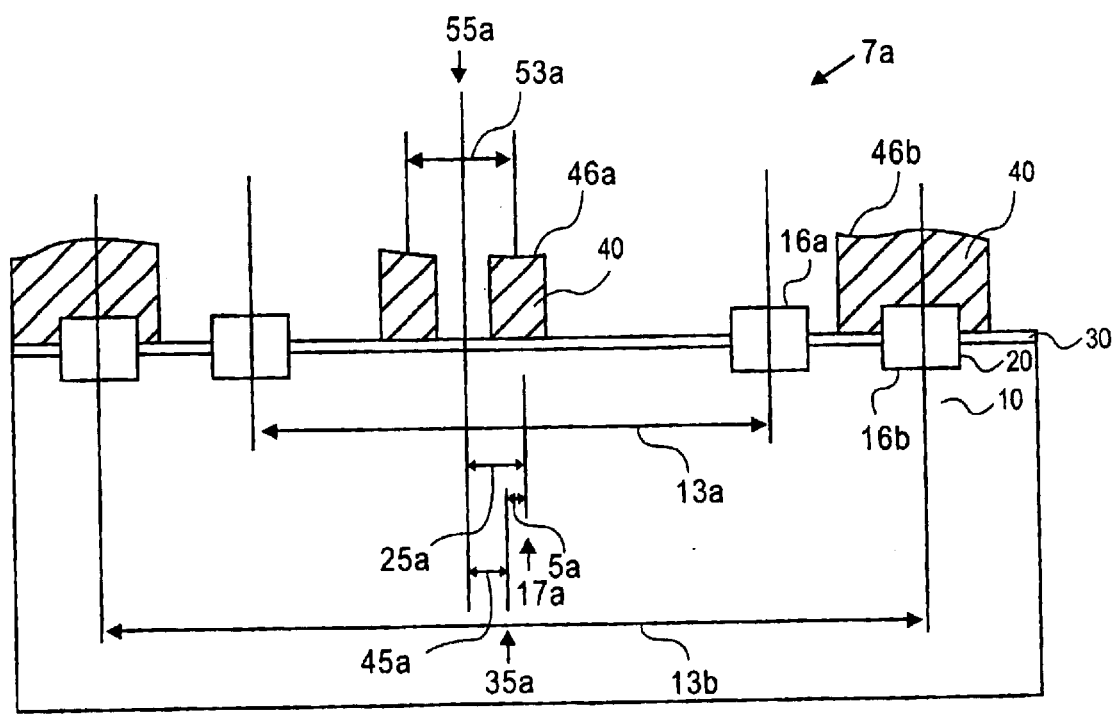
FIG. 3(b) is an illustration of a cross-sectional view of a novel overlay structure for a transparent film after etch.

Overlay of the novel overlay structure is also measured after etch. FIG. 3(b) shows a cross-sectional view of a novel overlay structure for a layer with transparent material 40, such as polysilicon, on a wafer 7a after etch. The inner bars 46a are formed from the transparent material 40. The first set 16a of outer bars is now exposed or uncovered since the overlying transparent film 40 has been removed by the etch. Consequently, the first set 16a of outer bars resembles a post-etch condition. However, the second set 16b of outer bars is still embedded below or covered by the transparent film 40. Consequently, the second set 16b of outer bars resembles a post-develop condition.

First, the centerline 55a of the inner bars 46a is determined from the midpoint of the distance 53a between the centers of the inner bars 46a. The inner bars 46a are nominally parallel to but located some distance away from the first set 16a of outer bars and the second set 16b of outer bars. Second, the centerline 17a of the first set 16a of outer bars is determined from the midpoint of the distance 13a between the centers of the first set 16a of outer bars. Third, the centerline 35a of the second set 16b of outer bars is determined from the midpoint of the distance 13b between the centers of the second set 16b of outer bars.

Some typical dimensions are as follows. The distance 53a between the centers of the inner bars 46a may be about 16.0 micrometers. The distance 13a between the centers of the first set 16a of outer bars may be about 28.0 micrometers. The distance 13b between the centers of the second set 16b of outer bars may be about 35.0 micrometers. As product devices continue to be scaled down, the overlay structure of the present invention can be made smaller by reducing these distances to about 30–40% of the values given above.

The overlay for the post-develop condition is calculated as the difference 45a between the centerline 55a of the inner bars 46a and the centerline 35a of the second set 16b of outer bars. The overlay for the post-etch condition is calculated as the difference 25a between the centerline 55a of the inner bars 46a and the centerline 17a of the first set 16a of outer bars. The difference between the overlay for the post-etch condition and the overlay for the post-develop condition is the exposed-to-embedded overlay offset. This offset can be used to correct subsequent measurements of overlay after develop.

Figure 4A:
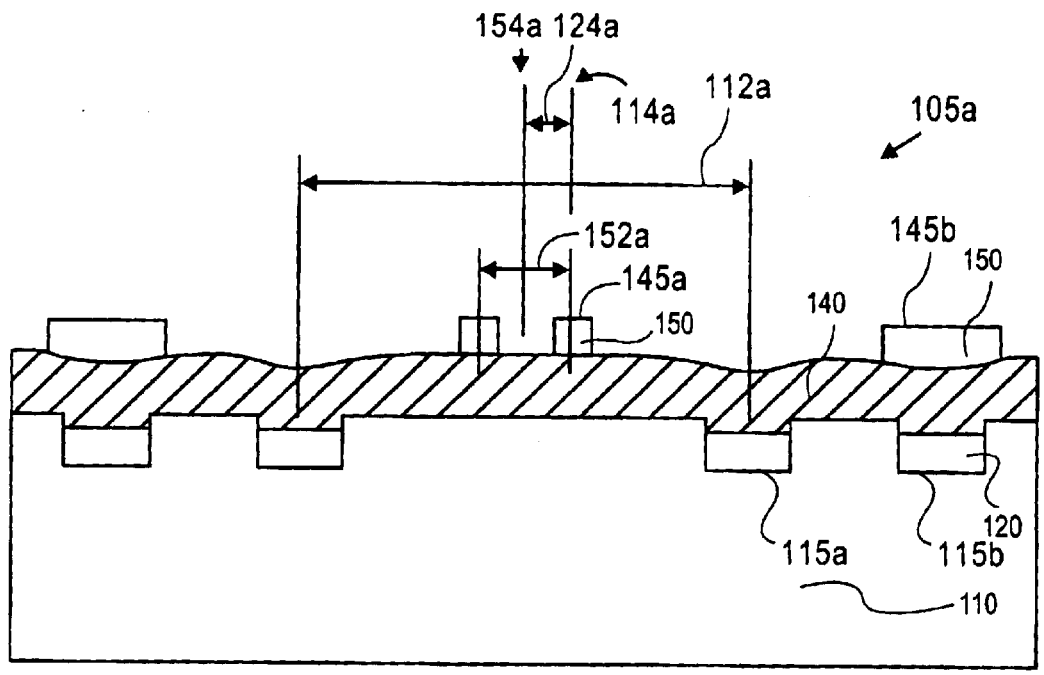
FIG. 4(a) is an illustration of a cross-sectional view of a novel overlay structure for an opaque film after develop.

FIG. 4(a) shows a cross-sectional view of a novel overlay structure for a layer with opaque material 140, such as Aluminum, on a wafer 105a after develop of photoresist. The substrate 110 is a dielectric material, such as silicon oxide, that covers transistors fabricated in a semiconductor material such as silicon. In one embodiment of the present invention, a first set 115a of outer bars and a second set 115b of outer bars are formed at an earlier layer, such as contact layer, from holes that have been filled with another opaque material 120, such as Tungsten. The first set 115a of outer bars and the second set 115b of outer bars are parallel and located near each other. They are usually coplanar as well. After depositing a layer of opaque material 140 over the entire wafer 105a at a subsequent layer, such as first metal layer, photoresist is applied. A step-and-scan tool aligns the pattern for a subsequent layer (on a mask) to the pattern for an earlier layer (on the wafer) and then exposes the photoresist through the mask to form a latent image of the desired pattern from the mask in the photoresist. The inner bars 145a are formed after developing the photoresist 150. Protective pads 145b are also formed in the photoresist over the second set 115b of outer bars.

Overlay of the novel overlay structure is initially measured after develop. First, the centerline 154a of the inner bars 145a is determined from the midpoint of the distance 152a between the centers of the inner bars 145a. The inner bars 145a are nominally parallel to but located some distance away from the first set 115a of outer bars and the second set 115b of outer bars. Second, the centerline 114a of the first set 115a of outer bars is determined from the midpoint of the distance 112a between the centers of the first set 115a of outer bars. Finally, the overlay after develop is calculated as the difference 124a between the centerline 154a of the inner bars 145a and the centerline 114a of the first set 115a of outer bars. The second set of outer bars 115b is not usually measured after develop since it is embedded below the opaque material 140 which is covered by the protective pads 145b in photoresist.

Figure 4B:
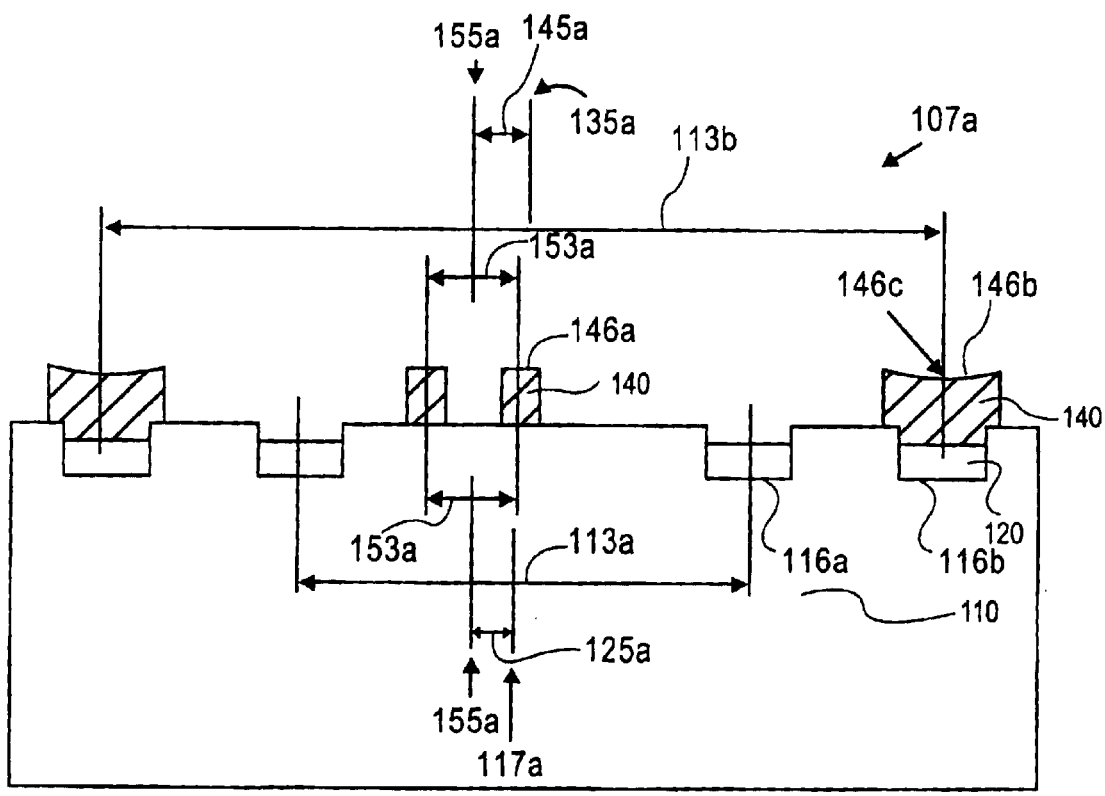
FIG. 4(b) is an illustration of a cross-sectional view of a novel overlay structure for an opaque film after etch.

FIG. 4(b) shows a cross-sectional view of a novel overlay structure for a layer with opaque material 140, such as aluminum, on a wafer 107a after etch. The first set 116a of outer bars is now exposed or uncovered since the overlying opaque material 140 has been removed by the etch. The second set 116b of outer bars is still embedded below or covered by the blocks 146b formed from the opaque material 140. The inner bars 146a are formed from the opaque material 40.

Overlay of the novel overlay structure is also measured after etch. FIG. 4(b) shows a cross-sectional view of a novel overlay structure for a layer with an opaque material 140, such as aluminum, on a wafer 107a after etch. The inner bars 146a are formed from the opaque material 140. The first set 116a of outer bars is now exposed or uncovered since the overlying opaque film 140 has been removed by the etch. Consequently, the first set 116a of outer bars resembles a post-etch condition. However, the second set 116b of outer bars is still embedded below or covered by the opaque film 140. Consequently, the second set 116b of outer bars resembles a post-develop condition.

First, the centerline 155a of the inner bars 146a is determined from the midpoint of the distance 153a between the centers of the inner bars 146a. The inner bars 146a are nominally parallel to but located some distance away from the first set 116a of outer bars and the second set 116b of outer bars. Second, the centerline 117a of the first set 116a of outer bars is determined from the midpoint of the distance 113a between the centers of the first set 116a of outer bars. Third, the centerline 135a of the second set 116b of outer bars is determined from the midpoint of the distance 113b between the centers of the dimples 146c located over the second set 116b of outer bars.

The opaque material 140 prevents direct measurement of the second set 116b of outer bars so the dimples 146c in the opaque material 140 are measured instead. The dimples 146c exist because the opaque material, such as Tungsten, in the holes is slightly recessed at the previous layer during the formation of the first set 116a and the second set 116b of outer bars. The process of chemical-mechanical polishing (CMP) performed on the opaque material 140 may cause the dimples 146c to be slightly off-center from the second set 116b of outer bars, but this apparent error will also occur in the product die.

The overlay for the post-develop condition is calculated as the difference 145a between the centerline 155a of the inner bars 146a and the centerline 135a of the dimples 146c located over the second set 116b of outer bars. The overlay for the post-etch condition is calculated as the difference 125a between the centerline 155a of the inner bars 146a and the centerline 117a of the first set 116a of outer bars. The difference between the overlay for the post-etch condition and the overlay for the post-develop condition is the exposed-to-embedded overlay offset. This offset can be used to correct subsequent measurements of overlay after develop.

Figure 5:
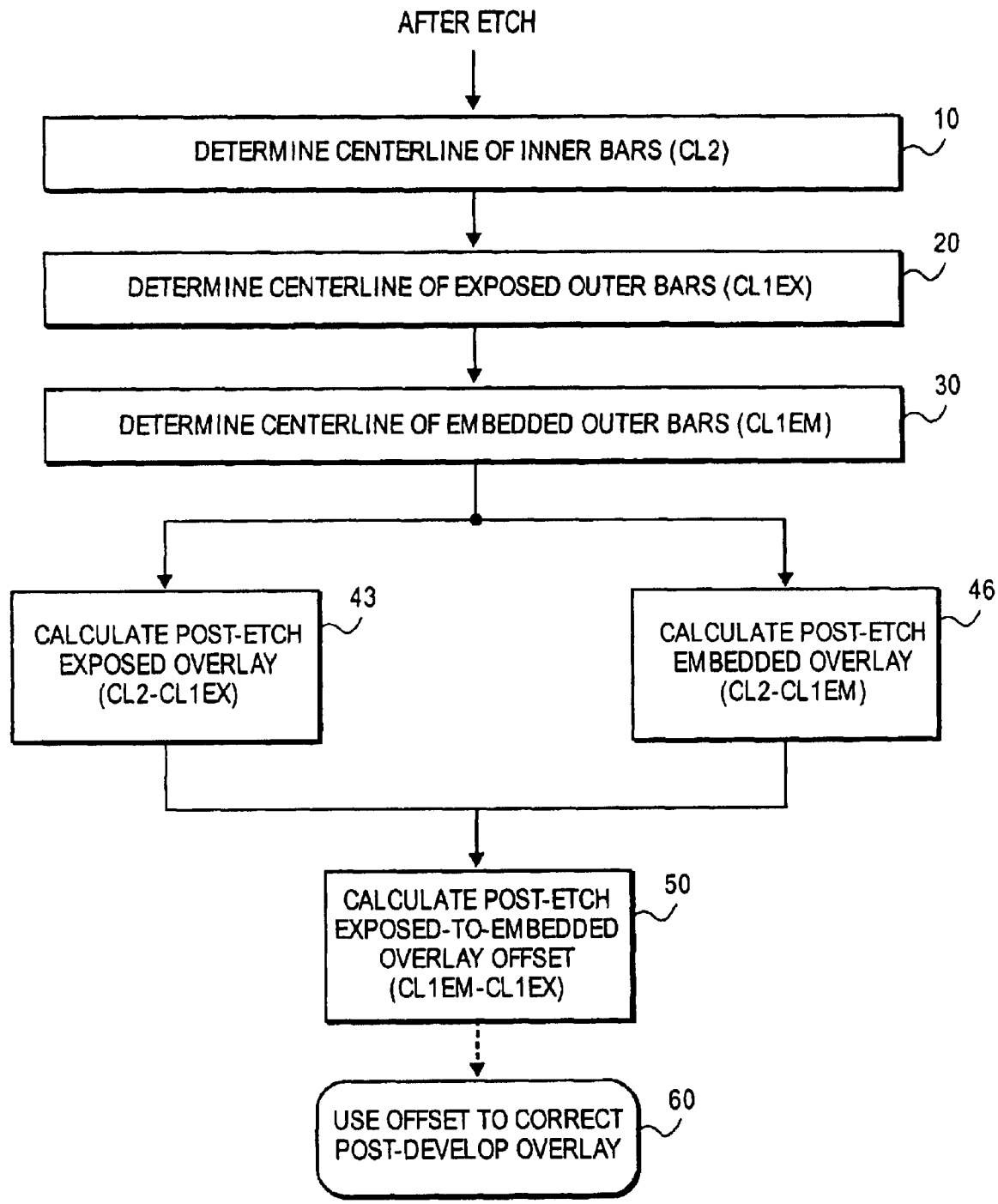
FIG. 5 is a flowchart of a methodology to determine an offset to correct post-develop overlay measurement.

Another embodiment of the present invention is a methodology shown in FIG. 5. First, as shown in block 10, the centerline 55a (CL2) of the inner bars 46a is determined from the midpoint of the distance 53a between the centers of the inner bars 46a. Second, as shown in block 20, the centerline 17a (CL1EX) of the exposed first set 16a of outer bars is determined from the midpoint of the distance 13a between the centers of the exposed first set 16a of outer bars. Third, as shown in block 30, the centerline 35a (CL1EM) of the embedded second set 16b of outer bars is determined from the midpoint of the distance 13b between the centers of the embedded second set 16b of outer bars. Fourth, as shown on block 43, the post-etch exposed overlay is calculated as (CL2−CL1EX). Fifth, as shown in block 46, the post-etch embedded overlay is calculated as (CL2−CL1EM). This is equivalent to the standard post-develop overlay. Sixth, as shown in block 50, the post-etch exposed-to-embedded overlay offset is calculated as (CL1EM−CL1EX). Finally, as shown in block 60, the post-etch exposed-to-embedded overlay offset is used to correct the post-develop overlay measurement.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

What is claimed is:

1. A method comprising:

forming a first set and a second set of features in a substrate;

covering said first and second set of features with material;

forming a third set of features in said material and removing said material to expose said first set of features, leaving said second set of features embedded below said material;

measuring post-etch overlay between said first set and said third set of features; and measuring post-develop overlay between said second set and said third set of features.

2. The method of claim 1 further measuring an exposed-to-embedded offset between said first set and said second set of features.

3. The method of claim 2 wherein said exposed-to-embedded offset corrects subsequent measurements of post-develop overlay to predict post-etch overlay.

4. The method of claim 1 wherein said material is transparent.

5. The method of claim 1 wherein said material is opaque.

6. A method comprising:

determining centerline of a first set of features formed in a substrate and not covered with a material;

determining centerline of a second set of features formed in said substrate and covered with said material, said second set and said first set of features being formed together in said substrate;

determining centerline of a third set of features formed in said material;

determining overlay of said third set to said first set of features; and determining overlay of said third set to said second set of features.

7. The method of claim 6 further determining overlay of said first set to said second set of features.

8. The method of claim 6 wherein said centerline is determined optically.

* * * * *